SEMICONDUCTOR DEVICE WITH PRESSURE
MAINTAINED NON-BONDED CONNECTORS

Filed Aug. 29, 1962

2 Sheets-Sheet 1

United States Patent Office 3,280,385

Patented Oct. 18, 1966

3,280,385

SEMICONDUCTOR DEVICE WITH PRESSURE MAINTAINED NON-BONDED CONNECTORS

Reimer Emeis, Ebermannstadt, Germany, assignor to Siemens-Schuckertwerke Aktiengesellschaft, Berlin-Siemensstadt, Germany, a corporation of Germany Filed Aug. 29, 1962, Ser. No. 220,336

Claims priority, application Germany, Sept. 2, 1961, S 75,565

7 Claims. (Cl. 317—234)

My invention relates to electronic semiconductor devices and to improvements of such devices as disclosed in my copending applications Serial No. 209,047, filed July 11, 1962 and Serial No. 208,988, filed July 11, 1962, now Patent No. 3,233,309.

In a more particular aspect, my invention relates to rectifiers, transistors, photocells and other electronic devices of the type comprising an essentially monocrystalline semiconductor body in broad-area connection with a carrier plate of good electrical and thermal conductance whose thermal coefficient of expansion does not appreciably differ from that of the semiconductor material so as to prevent the occurrence of mechanical damage to the crystal under the effect of changes in temperature as occurring in the operation of the device. For semiconductors of silicon or germanium, the carrier plate may consist of molybdenum or tungsten, for example. As a rule, the carrier plate is joined with a heat-sink structure, such as a block of copper having cooling vanes or with a member of a coolant water circulation system.

The connection of the carrier plate with the heat-sink structure must occupy a largest feasible area for good heat-transfer and slight electrical resistance at the transition. When using soft solder, for example tin or lead solder, for joining the carrier plate with the heat sink, it may happen that high electric loads and a correspondingly intensive generation of heat will locally heat the solder beyond the melting temperature, thus impairing or loosening the bond. When employing hard solder, such as silver solder or the like, the necessary high soldering temperature may detrimentally affect the properties of the semiconductor member previously firmly bonded with the carrier plate. The application of pressure, fluxing agent and other expedients for the production of such solder joints, tends to be accompanied by noxious side effects, such as mechanical tension or impurities, which affect the electrical properties of the semiconductor device or may jeopardize achieving or preserving these properties.

Also known are semiconductor devices in which the carrier plate, bonded with the semiconductor body, is connected without soldering or the like to a heat-sink block of soft copper by inserting the carrier plate at least partially into a recess of the block and then fastening the plate by plastically deforming the block. However, this type of attachment, known for example from the German published patent application 1,098,103, is not applicable when using a carrier plate whose thermal coefficient of expansion is similar to that of the semiconductor material because a connection produced only by plastic deformation of the heat-sink structure becomes loosened during operation by repeated heating and cooling and the resulting differences in thermal expansion of carrier plate and heat sink respectively.

It is an object of my invention to eliminate the abovementioned disadvantages and shortcomings of the known semiconductor devices and to provide a reliable and permanent pressure-contact connection between the carrier plate, already bonded together with the semiconductor body, on the one hand, and an adjacent body or heat-sink structure of good conducting metal on the other hand.

Another, more specific object of the invention is to secure a reliable connection between these two components and to preserve a good thermal and electrical contact engagement even if the semiconductor device is subjected to frequently changing electrical loads and correspondingly frequent changes in temperature conditions.

To achieve these objects, as well as those mentioned hereinafter, a semiconductor device, having a plate-shaped and substantially monocrystalline semiconductor body such as a disc of silicon, bonded on one flat side to a metal plate of similar coefficient of expansion, is provided with a broad-area, good conducting pressure-contact connection between the just-mentioned metal plate and a current-supply member whose contact surface is at least nearly as large as the bonding area between the semiconductor body and the above-mentioned metal plate; and according to an essential feature of my invention, one of the two contact surfaces of the pressure-contact connection consists of a noble metal such as silver, gold or platinum, whereas the other contact surface consists of a metal that does not form an alloy with that noble metal. Furthermore, at least one of the two mutually engaging contact surfaces has uniform roughness over the entire contact area and a roughness depth between 0.5 and 50 microns, preferably between 1 and 3 microns, and each of the two contact surfaces is planar to such a high degree that any departures of the median surface from a geometric plane are not larger than the roughness depth.

By virtue of such a pressure-contact connection between the carrier plate area-bonded to the semiconductor body and the adjacent heat-sink or other metal structure, the two pressure-engaged contact surfaces can laterally glide with respect to each other in directions approximately perpendicular to the current-flow direction, so that any different amounts of thermal elongation of the carrier plate and the adjacent metal body, as may occur during operation of the semiconductor device, are compensated by relative gliding motion without causing the occurrence of appreciable mechanical tension. It has been found that even in the event of frequent changes in load current between the zero value and the permissible maximum, the good contact properties with respect to conductance of electric current and heat, remain substantially preserved and invariable permanently.

The foregoing and other objects, advantages and features of my invention, said features being set forth with particularity in the claims annexed hereto, will be apparent from, and will be mentioned in, the following with reference to the embodiments of semiconductor devices according to the invention illustrated by way of example on the accompanying drawings in which:

Figure 1:
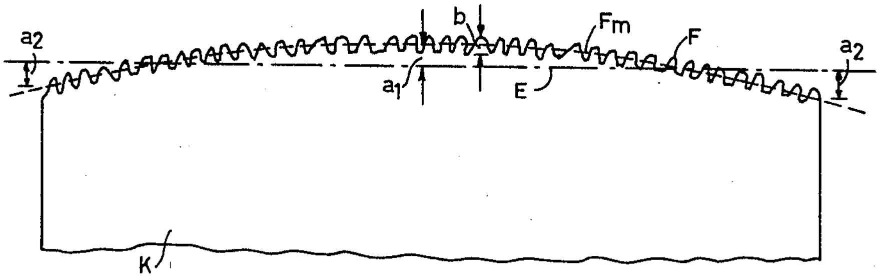
FIG. 1 is explanatory and shows diagrammatically a sectional view of a contact surface for the purpose of demonstrating the terms "roughness depth" and "median surface."

Denoted in FIG. 1 by K is a portion of a pressure contact whose contact surface F is uniformly rough. The illustration is on a greatly enlarged scale, the vertical dimensions being much more enlarged than the horizontal ones to make the roughness more clearly apparent.

The "roughness depth" is indicated by the distance $b$ between the bottom of a groove and the most outwardly protruding point or crest of an adjacent projection, and denotes the depth value averaged over the entire contact surface F in the assumption that the individual depth values do not essentially depart from each other on account of the uniformity of the roughness.

The "median surface" $F_m$, represented by a broken, curved line, is developed from the rough surface F by observing the condition that the total volume of all recesses below the surface $F_m$ is equal to the total volume of all projections protruding upwardly beyond the surface $F_m$. Drawn through the median surface $F_m$ is a geometric plane E which extends perpendicularly to the plane of illustration and is indicated by a dot-and-dash line. This plane is so located that the departures of the median surface $F_m$ above and below the plane E are of equal size. The largest departure of the surface $F_m$ from the plane E upwardly is denoted by $a_1$ and is located at about the middle of the contact surface F. The largest departures of the surface $F_m$ from the plane E downwardly are located at the two outer edges of the contact surface and are denoted by $a_2$. In other words, the position of the plane E is defined by the condition that $a_1=a_2$. Any rounding of the edges is disregarded by extrapolating the broken line $F_m$ toward both edges with the same amount of curvature as in the adjacent, not appreciably rounded circular or annular zone of the contact surface. The intersections of these extrapolated extensions with the lateral (vertical) boundary lines of the contact K thus constitute one end point for determining the dimension $a_2$, those other end point is determined by the geometric plane E.

Since the amounts of departure $a_1$ and $a_2$, as shown in FIG. 1, are larger than the roughness depth $b$ it will be recognized that the contact surface F, as diagrammatically represented in FIG. 1, would not satisfy the requirements of the invention.

Figure 2:
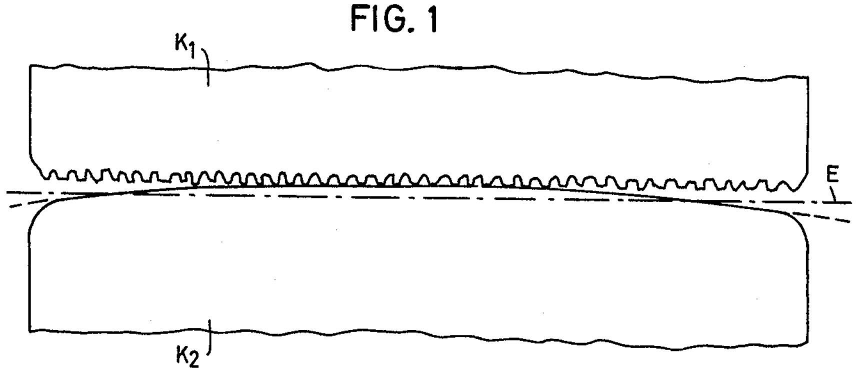
FIG. 2 is an explanatory and diagrammatic showing of a pressure-contact connection according to the invention in a representation similar to that of FIG. 1.
Figure 3:
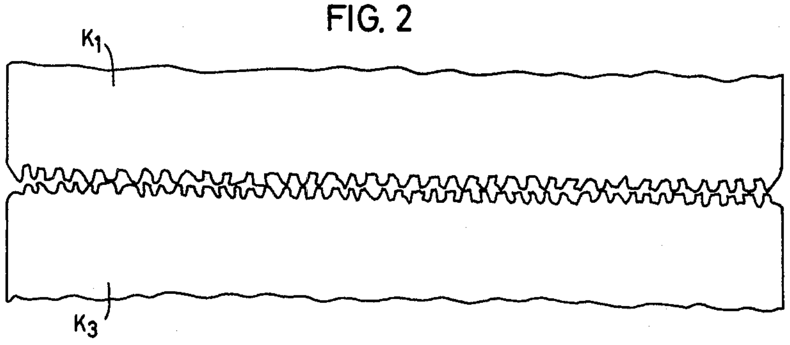
FIG. 3 shows, in similar diagrammatic form, a modification of a pressure-contact connection according to the invention.

In contrast thereto, the pressure-contact conditions to be met by a semiconductor device according to the invention are satisfied by the contact $K_1$ of which a portion is shown in each of FIGS. 2 and 3 on a similar scale and in the same manner as in FIG. 1. The contact surface of contact $K_1$ in FIG. 2 or FIG. 3 is virtually planar. The planar shape can be produced by an optical grinding method or by the same lapping method as conventionally employed for preparing or finishing semiconductor wafers of silicon or germanium. The lapping of the contact surface is performed by employing a lapping agent or abrasive of such a fine granulation that the prescribed roughness depth is secured. For this purpose the type of oil usually employed for the lapping of semiconductor wafers can also be used as auxiliary lapping agent. The use of glycerine as auxiliary lapping agent has been found particularly favorable because it can be easily rinsed off with distilled water.

The above-mentioned contact member $K_1$ according to FIG. 2 or 3 may be identical with the above-mentioned carrier plate of molybdenum or tungsten whose other flat side, not shown in FIGS. 2 and 3, is bonded to the semiconductor body, such as a wafer of silicon, for example by the alloying method known for such purposes. In this case the cooperating contact $K_2$ or $K_3$ according to FIGS. 2 and 3 of the pressure-contact connection, stil to be described more in detail, may be made of silver. That is, since neither molybdenum nor tungsten form an alloy with silver, the free surface of the carrier plate itself, after being suitably processed, for example by the above-mentioned lapping method, to secure the necessary accuracy of planar shape and the required degree of roughness, can directly serve as a contact surface within the pressure-contact connection.

Instead of silver, other noble metals, such as gold or platinum, can be employed. Another way of applying the invention is to provide the contact member $K_1$ with a surface layer or coating of a noble metal and to employ for the counter contact $K_2$ or $K_3$, or at least for a surface coating on this counter contact, a metal that does not alloy with the particular noble metal. Thus, for example, iridium can be employed as a surface coating on contact $K_2$ or $K_3$ if the contact $K_1$ or its surface portion consists of gold. Nickel can be employed for the counter contact $K_2$ or $K_3$, or for the surface coating on the counter contact, if the contact member $K_1$ or the surface portion thereof consists of platinum or another noble metal of the platinum group in the periodic system of elements.

In an embodiment preferred on account of its particular simplicity and advantage, the contact $K_1$ is made of molybdenum, whereas the contact $K_2$ or $K_3$ consists, at least at its contacting surface, of silver and constitutes a component of a base plate or other heat-sink structure of copper.

As shown in FIG. 2, the contact surface of contact member $K_2$ has less roughness than the contact surface of member $K_1$. This is the case, for example, when the contact surface of member $K_2$ is smoothed by polishing. As a rule, such surface treatment causes the polished surface to become convex and to assume a rounded outer edge as diagrammatically illustrated in FIG. 2. Such curvature at the edges is not detrimental from the viewpoint of the invention, if the departures of the polished contact surface on both sides of a geometric plane E are not larger than the roughness depth of the other contact surface. This condition is satisfied, according to FIG. 2, neglecting the rounded outer edge as explained above with reference to FIG. 1. In this case, and assuming a sufficient magnitude of contact pressure is applied, virtually the entire contact surface can be considered to be active in supporting the current flow because the contact pressure causes the occurrence of a corresponding, partly permanent and partly elastic, deformation of the projections on the counter contact surface $K_1$. The increased curvature at the very edges merely reduce the effective contact surface by a corresponding narrow marginal zone.

According to FIG. 3, the contact surface of the lower contact $K_3$ is likewise lapped by means of a sufficiently fine-granular grinding powder, thus avoiding a bulging of the contact surface as well as a curvature at the outer edges.

As mentioned, the contact $K_2$ and $K_3$ preferably forms part of a terminal or heat-sink body of copper which serves for supplying electric current and may also contribute to dissipating generated heat from the semiconductor member. If such a body of copper is provided with a silver coating on the contact surface, the relatively high rate of diffusion of copper in silver poses the problem that when the silver coating is relatively thin, an appreciable amount of copper may diffuse up to the contact surface after an operating period of longer or shorter duration. Such migration of copper through the silver to the contact surface tends to appreciably impair the glidability locally by alloying phenomena between the copper particles and the counter-contact surface of molybdenum or tungsten. Subsequent alternating thermal stresses may then have the result that small quantities of the softer metals, copper and silver, are entrained and smeared over the contact surface by the mutual displacement of the two contact surfaces caused by their respectively different thermal expansion. In this manner, metal accumulations may form at singular localities and ultimately lift the contacts from each other at the other localities. For a given current loading, therefore, an increased current density will result at the smeared localities with the effect of local overheating and eventual damaging of the semiconductor device.

It is another object of my invention, therefore, to obviate this danger. I have found that this can be achieved by giving the silver coating a thickness of at least about 0.3 mm. It is preferable to keep the thickness of the silver coating or surface layer 0.05 and 0.3 mm. Within this range, the value to be chosen is higher, the greater the expectable frequency of changes in electrical load. The smallest value of thickness is usually sufficient in rectifier diodes for feeding electrolytic baths and other electric loads of uniform current consumption, whereas higher thickness values, up to the upper limit of the mentioned range, are preferable, for example, in power rectifiers for use on vehicles and for rectifiers to be employed in welding apparatus.

Silver coatings of such a relatively large thickness are rather difficult to produce by electrolytic or electrophoretic means, particularly in view of the necessary uniformity in thickness over a rather large contact area. As a rule, therefore, these coating methods are unfavorably intricate and time-consuming. It is easier and preferable to place between the contact surfaces a silver foil produced by rolling with uniform foil thickness. Such a silver foil, preferably annealed in vacuum before employing it, can readily be bonded to that portion of the pressure-contact connection that consists of copper or other metal readily alloyable with silver. The bonding can then be effected by moderately heating the silver foil between the contact surfaces, whereafter the silver foil becomes area-bonded to the alloyable metal. The above-mentioned high diffusion rate of copper in silver is desirable in this case because it promotes the fastening and joining of the silver layer to the copper structure by diffusion.

The moderate heating just mentioned can be effected in a separate processing step while the pressure-contact assembly is being subjected to sufficient pressure. Since the temperature required for this purpose can be kept lower than the maximum permissible operating temperature of the semiconductor device, the silver foil can also be fastened to the copper body by simply subjecting the finished semiconductor device to a preliminary operation at essentially constant load, or also by placing the semiconductor device in electric operation but making certain that at least initially the changes in alternating load are kept within small limits.

The area pressure between the two contact surfaces of the pressure-contact connection is preferably kept between about 100 and 500 kg./cm.$^2$ of the contact area. A pressure near the lower limit is sufficient if the two contact surfaces, on the average, depart little from a geometric plane. Consequently, for a contact device according to FIG. 2, a pressure magnitude near the upper limit of the mentioned range is preferable, whereas a contact device according to FIG. 3 or similar devices do not require more than a pressure magnitude near the lower limit.

The numerical data given in the foregoing relate essentially to the use of silver as a noble metal. For other noble metals, such as gold and platinum, the data exemplified for the above-described devices can readily be modified analogously in accordance with the known properties of these metals.

Figure 4:
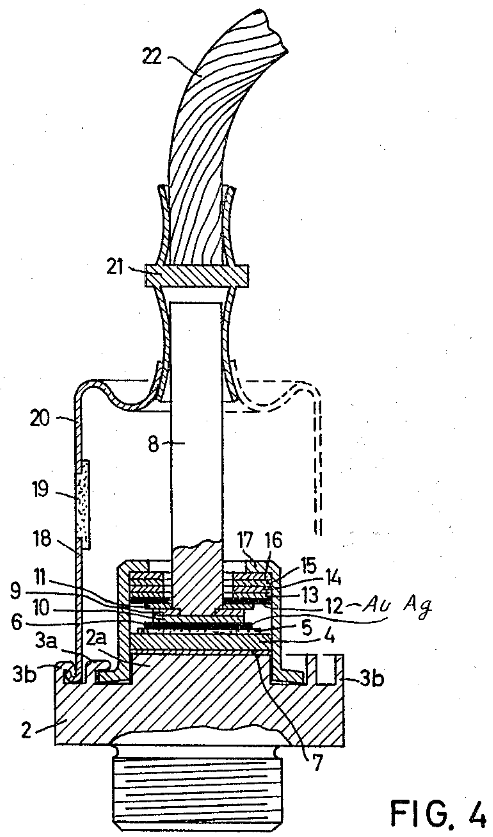
FIG. 4 is a sectional view of a silicon power rectifier of the diode type according to the invention.

The encapsuled rectifier illustrated in FIG. 4 comprises a massive copper block 2 of circular shape which has an integral threaded bolt and serves as a heat-sink structure. The copper block 2 is provided with a central projection 2*a* upon which the carrier plate of the semiconductor assembly proper is fastened. An annular projection 3*a* concentrically surrounding the projection 2*a* serves for fastening a clamp or holder 17. An annular concentric edge portion 3*b* of the copper block, protruding upwardly in concentric relation to the projection 2*a*, serves for fastening a housing portion of the capsule to the copper block, as will be more fully described below. Mounted on the central projection 2*a* is the rectifier assembly proper, consisting of a sandwich composed of a carried plate 4, a semiconductor disc 5 alloy-bonded with the carried plate 4, an electrode 6 area-bonded with the semiconductor plate and forming a p-n junction therewith. The rectifier sandwich assembly can be produced, for example, as follows.

Placed upon a molybdenum disc of about 22 mm. diameter is an aluminum disc of about 19 mm. diameter. Placed upon the aluminum disc is a monocrystalline circular plate of p-type silicon having a specific resistance of about 1000 ohm cm. and a diameter of about 18 mm. Positioned upon the silicon plate is a gold foil with about 0.5% antimony content, which has a smaller diameter, for example 14 mm., than the silicon disc. This sandwich assembly is embedded in a powder that does not react with the just-mentioned materials and does not melt at the alloying temperature. Suitable as such powder is graphite. The embedded assembly is then heated within the embedding powder under pressure to a temperature of about 800° C. The heating can be effected in an alloying surface evacuated or filled with protective gas. Thereafter the assembly is permitted to cool to room temperature. Then the two flat sides of the sandwich are lapped to planar shape with the aid of a grinding agent of suitable fine-granular constitution and are thereafter cleaned from the lapping residues.

During the alloying procedure just described, the gold foil becomes alloyed together with the adjacent zone of the silicon, and the alloyed region becomes doped with antimony and assumes n-type conductance, thus forming a p-n junction in the silicon body. Upon completion of the lapping operation, the outer edge of the p-n junction emerges at the free semiconductor surface. This surface is then subjected to etching which can be carried out in known manner, for example as described in U.S. Patent 3,010,885 or U.S. Patent 3,041,225 Serial No. 820,533. Residues of the etching agent can be rinsed off with distilled water. It is preferable to follow the etching operation by an oxidation process, for example as described in U.S. Patent 3,010,885, or by rinsing with a ten times or more diluted solution of the chemical etching agent previously employed, or also by subjecting the assembly for a few minutes to an atmosphere to which vapor from this etching agent has been added.

According to FIG. 4, a thick silver layer 7 is interposed between the molybdenum carrier plate 4 of the rectifier sandwich assembly described above and the central projection 2*a* of the copper body 2. The silver layer 7 consists of a foil having 100 to 200 micron thickness.

The foil 7 is preferably provided on both sides with a raised pattern, for example a waffle pattern similar to the knurling of knurled knobs. According to a preferred embodiment, the silver foil is first annealed and subsequently etched, for example with the aid of nitric acid, whereby a fine etching pattern on the surface is produced.

Placed upon the top side of the semiconductor assembly, that is upon the electrode 6 consisting of a gold-silver eutectic, is a plunger-shaped member. Before being assembled with the rectifier sandwich, this member is preferably composed of its individual components, namely a copper pin 8, a washer 9 of copper and a disc 10 of molybdenum. The three parts 8, 9, 10 are firmly joined with each other. This can be done by hard soldering. The bottom side of the molybdenum disc 10 is preferably silver plated and is thereafter lapped to planar shape. During operation of the device, a rigid and firm connection comes about between the silver coating of disc 10 and the gold-containing electrode 6 due to the heat which is generated by the operation of the rectifier device and which causes a partial and mutual diffusion of silver and gold particles at the contacting area.

If desired, however, a rigid connection between the plunger assembly and the electrode 6 of the rectifier sandwich can also be produced during manufacture of the encapsulated device. This can be done by applying moderate heating of the parts while they are being kept pressed against each other. The temperature required for this purpose is 200 to 250° C. and a heating period of two or a few hours is sufficient.

Positioned on the plunger-shaped part are a washer 11 of steel, a disc 12 of mica, another washer 13 of steel, and three ring-shaped springs 14, 15 and 16. The springs have curved shape when not under pressure. After assembling these parts, a bell-shaped holder 17 is placed over the copper pin 8. The holder 17 has a bottom flange which is thereafter fastened to the copper body 2 by bending the projection *3a* from the straight shape shown on the right-hand side of FIG. 4 to the deformed shape shown at the left-hand side. The upper part of the holder 17 constitutes an abutment for the disc springs 14, 15, 16 which, in assembled condition of the semiconductor device, are compressed to planar shape and then exert the necessary contact pressure against the rectifier sandwich, thus forcing the sandwich with its molybdenum carrier plate 4 against the silver layer 7. As explained, the silver layer 7 coalesces with the copper block 2, and the contact surfaces between the molybdenum carrier plate 4 and the silver coating 7 then constitute a pressure contact in accordance with the features of the present invention explained above.

As apparent from FIG. 4, a device according to the present invention affords an extremely compact design in which all component parts are accurately secured in proper position to one another and therefore cannot become displaced by mechanical jarring nor by thermal displacements. Essential in this respect is the function of the mica disc 12 which serves for electrically insulating the holder 17 from the top side of the semiconductor assembly as well as for centering the pin 8. For this purpose the outer edge of the mica disc 12 abuts against the cylindrical inner wall of the holder 17, and the inner edge of the mica disc 12 touches the copper pin 8.

The assembling work is completed by placing a bell-shaped housing portion, composed of individual parts 18, 19, 20 and 21, over the entire arrangement so far described. As its lower rim, the part 18 has an outwardly projecting flange which is fastened to the copper block 2 by deforming the marginal projection *3b* of the block, shown in original shape at the right-hand side of FIG. 4 and in ultimate shape at the left-hand side. The copper pin 8 is joined with the housing by pressing the part 21 firmly against the top portion of pin 8. The part 21 preferably consists of copper, whereas the parts 18 and 20 consist of steel or an iron-nickel-cobalt alloy such as available in the trade under the trade names Kovar or Vacon. Parts 20 and 21 are soldered or welded to each other. Part 19 is insulating and preferably consists of ceramic material. It is metallized at those places where it is joined with parts 18 and 20 so that they can be joined with part 19 by soldering. A cable 22, inserted from the outside into part 21, is joined therewith by a pressure connection.

It will be understood that the rectifier assembly proper, comprising the semiconductor body with the alloyed electrodes and alloy-bonded carrier plate, may have a constitution and design other than illustrated and described. For example, the semiconductor body may consist of germanium with alloy-bonded electrodes of indium or lead-arsenic. The carrier plate may consist, for example, of certain highly alloyed types of steel, particularly those containing nickle and cobalt, which possess a similar coefficient of expansion as the semiconductor material, such as germanium or silicon. The semiconductor body may also consist of silicon carbide or of an intermetallic (III–V) compound of respective elements from the third and fifth groups respectively of the periodic system of elements, or the semiconductor body may consist of a (II–VI) compound of respective elements from the second and sixth groups of the periodic system, semiconductor compounds of these types, as well as electrode and carrier-plate metals suitable therefor, being known for such purposes (for example, from the book Semiconductors, edited by N. B. Hannay, published 1959 by Reinhold Publishing Corp., New York, chapter 9 and pertaining bibliography).

Another advantage of the invention as described in the foregoing resides in the fact that the rectifier assembly, comprising the semiconductor body with alloyed electrodes and carrier or connecting plates, can also be inserted into the capsule in reversed electric orientation. This affords providing semiconductor diodes which have respectively different polarities but the same external design, the same electric characteristics, and also a similar internal design.

Figure 5:
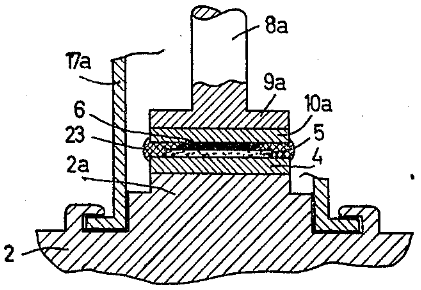
FIG. 5 is a fragmentary view of another semiconductor rectifier according to the invention.

An example of such a device is partially illustrated in FIG. 5, it being understood that the device otherwise corresponds to that described above with reference to FIG. 4. In the embodiment according to FIG. 5, the molybdenum plate 10*a* above the semiconductor disc 5 has the same size as the lower molybdenum plate 4. The connection between the plunger-shaped connector of copper, whose two parts 8*a* and 9*a* are here made of a single integral piece, and the molybdenum plate 10*a* is designed as a pressure-contact connection in the same manner as the lower pressure-contact connection between the molybdenum plate 4 and the base *2a* of the copper body 2. Each of the two pressure-contact connection 9*a*–10*a* and 5–4 possesses some amount of glidability in lateral directions. Such glidability can be augmented by means of graphite powder sprinkled between the two parts of each pressure-contact connection when assembling the device. This does not impair the good current and heat transfer properties. Since the molybdenum plate 10*a*, on account of its large diameter, protrudes beyond the annular free surface of the semiconductor body at which the p–n junction emerges, it is further of advantage to protect this surface portion by coating it with a thin layer of varnish. Suitable for this purpose, for example, is a silicone varnish with an addition of alizarin which is added to the semiconductor material subsequent to the above-mentioned ultimate etching, rising and oxidation treatment. The remaining interspace between the two equal-size molybdenum plates 4 and 10*a* is preferably filled with casting resin 23 which may be permitted to bulge and protrude outwardly as shown. This considerably increases the breakthrough voltage of the semiconductor device.

The subassembly comprising the two molybdenum plates 4 and 10*a* can also be arranged in reverse order without changing the arrangement of all other parts of the device, namely so that the plate 4 is on top and the plate 10*a* at the bottom of the semiconductor disc 5. In this case the forward direction of current flow is from top to bottom.

While the above-described embodiments relate to rectifier diodes, it will be obvious that the invention is not limited thereto but is likewise applicable to other semiconductor diodes with and without p–n junction, as well as to semiconductor triodes, such as transistors, four-layer devices of the p-n-p-n type such as semiconductor controlled rectifiers or switching devices, photoelements and photo-transistors, and also in multiple-component devices in which a plurality of such diodes and/or triodes are combined in a single semiconductor body.

Upon a study of this disclosure, such and other modifications with respect to design, number of components, and materials will be obvious to those skilled in the art and are indicative of the fact that my invention can be given embodiments other than particularly illustrated and described herein, without departing from the essential features of the invention and within the scope of the claims annexed hereto.

I claim:

1. An electronic semiconductor device comprising a plate-shaped and essentially monocrystalline semiconductor body, a metal plate alloy bonded to one flat side of said body in face-to-face area engagement therewith and having a thermal coefficient of expansion substantially similar to that of said body, pressure contact means having a contact member, said plate and said contact member having respective independent surfaces in mechanical pressure engagement with each other in an area at least nearly as large as said bonded area between said plate and said semiconductor body, one of said two contact surfaces consisting of a noble metal and the other surface consisting of a different metal non-alloying relative to said noble metal, at least one of said two surfaces being uniformly rough and having a roughness depth between 0.5 and 50 microns, each of said two contact surfaces being substantially planar and having any departure of its median surface in either direction from a geometric plane within the limit of said roughness depth.

2. In a semiconductor device according to claim 1, said roughness depth being between the limits of about 1 and about 3 microns.

3. In a semiconductor device according to claim 1, said metal plate being formed of substance selected from the group consisting of molybdenum and tungsten, and said noble metal being formed of substance from the group consisting of silver, gold and platinum.

4. An electronic semiconductor device comprising a plate-shaped and essentially monocrystalline semiconductor body, a metal plate alloy bonded to one flat side of said body in face-to-face area engagement therewith and having a thermal coefficient of expansion substantially similar to that of said body, pressure contact means comprising a heat-sink body of copper having a surface layer of silver, said silver layer and said plate having respective independent contact surfaces in mechanical pressure engagement with each other in an area at least nearly as large as said bonded area between said plate and said semiconductor body, said contact surface of said plate being of non-alloying metal relative to silver, at least one of said two surfaces being unformly rough and having a roughness depth between 0.5 and 50 microns, each of said two contact surfaces being substantially planar and having the departures of its median surface in either direction from a geometric plane within the limit of said roughness depth.

5. An electronic semiconductor device comprising a plate-shaped and essentially monocrystalline semiconductor body of silicon, a metal plate alloy bonded with said silicon body in face-to-face relation thereto and having a thermal coefficient of expansion more similar to that of silicon than to that of copper, pressure contact means comprising a heat-sink body of copper with a surface layer of silver having at least 0.05 mm. thickness, said silver layer and said plate having respective independent contact surfaces in mechanical pressure engagement with each other in an area at least nearly as large as said bonded area between said plate and said semiconductor body, said contact surface of said plate being of non-alloying metal relative to silver, at least one of said two surfaces being unformly rough and having a roughness depth between 0.5 and 50 microns, each of said two contact surfaces being planar with the departures of its median surface in either direction from the geometrically accurate plane within the limit of said roughness depth.

6. In a semiconductor device according to claim 5, said silver layer consisting of a silver foil bonded to said copper body.

7. A semiconductor device, comprising a semiconductor member comprising an essentially monocrystalline semiconductor plate having spaced opposite substantially parallel surfaces, contact electrode alloyed to each of the substantially parallel surfaces of said semiconductor plate, a first carrier plate alloy bonded to one of said contact electrodes at one of the surfaces of said semiconductor plate and a second carrier plate bonded to the other said contact electrodes at the opposite of the surfaces of said semiconductor plate, each of said first and second carrier plates being substantially of a metal having a thermal coefficient of expansion similar to that of said semiconductor plate;

a housing including a cooling body of heat conducting material having a surface in heat conductive contact with a surface of one of said first and second carrier plates and an electrical terminal in contact with the other of said first and second carrier plates; and holder means including pressure exerting means affixed to said cooling body in said housing and covering said semconductor member for maintaining contact pressure between said semiconductor member and said cooling body, said pressure exerting means being positioned in said holder means in abutting contact with and between said holder means and one of said first and second carrier plates for maintaining a pressure of 100 to 500 kg./cm.$^2$ between said semiconductor member and said cooling body.

References Cited by the Examiner

UNITED STATES PATENTS

| | | | |
|---|---|---|---|
| 2,244,771 | 6/1941 | Figuor | 317—238 |
| 2,402,839 | 6/1946 | Ohl | 317—240 |
| 2,476,886 | 7/1949 | Miller et al. | 339—278 |
| 2,712,619 | 7/1955 | Zetwo | 317—234 |
| 2,762,953 | 9/1956 | Berman | 317—234 |
| 2,817,979 | 12/1957 | Coyle | 317—234 |
| 2,863,105 | 12/1958 | Ross | 317—234 |
| 2,922,092 | 1/1960 | Gazzara et al. | 317—235 |
| 2,986,678 | 5/1961 | Andres et al. | 317—234 |
| 3,040,218 | 6/1962 | Byczkowski | 317—234 |

FOREIGN PATENTS

| | | |
|---|---|---|
| 936,104 | 12/1955 | Germany. |
| 877,674 | 9/1961 | Great Britain. |

JOHN W. HUCKERT, *Primary Examiner.*

JAMES D. KALLAM, *Assistant Examiner.*